US012781380B2

(12) United States Patent
Ohara et al.

(10) Patent No.: US 12,781,380 B2
(45) Date of Patent: Nov. 3, 2026

(54) MANUFACTURING METHOD OF QUARTZ GLASS CRUCIBLE

(71) Applicant: SUMCO CORPORATION, Tokyo (JP)

(72) Inventors: Masami Ohara, Akita (JP); Hiroshi Kishi, Akita (JP); Eriko Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 19/243,262

(22) Filed: Jun. 19, 2025

(65) Prior Publication Data

US 2025/0313985 A1 Oct. 9, 2025

Related U.S. Application Data

(62) Division of application No. 17/783,616, filed as application No. PCT/JP2020/040832 on Oct. 30, 2020, now Pat. No. 12,371,812.

(30) Foreign Application Priority Data

Dec. 23, 2019 (JP) ................................ 2019-231815

(51) Int. Cl.
*C30B 15/10* (2006.01)
*C03B 20/00* (2006.01)

(52) U.S. Cl.
CPC .............. *C30B 15/10* (2013.01); *C03B 20/00* (2013.01)

(58) Field of Classification Search
CPC ... C03B 19/095; C03B 20/00; C03B 2201/50; C03B 2201/54; C03C 15/00;
(Continued)

(56) References Cited

U.S. PATENT DOCUMENTS

| | | | |
|---|---|---|---|
| 5,885,365 | A | 3/1999 | Sugai et al. |
| 2010/0107965 | A1 | 5/2010 | Fukui et al. |

(Continued)

FOREIGN PATENT DOCUMENTS

| | | | |
|---|---|---|---|
| JP | H07330483 A | | 12/1995 |
| JP | H1143392 A | * | 2/1999 |

(Continued)

OTHER PUBLICATIONS

A Request for the Submission of an Opinion issued by Korean Intellectual Property Office on Jan. 25, 2024, for Korean counterpart application No. 10-2022-7022558 (5 pages).

(Continued)

*Primary Examiner* — Hua Qi
(74) *Attorney, Agent, or Firm* — Law Office of Katsuhiro Arai

(57) ABSTRACT

A manufacturing method of a quartz glass crucible includes: producing a quartz glass crucible by arc-melting raw material quartz powder deposited on an inner surface of a rotating mold; washing an inner surface of the quartz glass crucible with pure water thereby reducing a total concentration of Na, K, and Ca contained in a silica glass around the inner surface as compared to that before washing; and etching the inner surface with washing liquid containing hydrofluoric acid.

7 Claims, 9 Drawing Sheets

(58) Field of Classification Search
CPC ... C03C 2201/50; C03C 2201/54; C03C 3/06; C30B 15/10; C30B 29/06
See application file for complete search history.

(56) References Cited

U.S. PATENT DOCUMENTS

| | | | | |
|---|---|---|---|---|
| 2011/0256330 | A1* | 10/2011 | Yamagata | C01B 33/12 65/17.3 |
| 2019/0145019 | A1 | 5/2019 | Kishi et al. | |

FOREIGN PATENT DOCUMENTS

| | | | | |
|---|---|---|---|---|
| JP | 2002179495 | A | | 6/2002 |
| JP | 2005306708 | A | | 11/2005 |
| JP | 2005320241 | A | | 11/2005 |
| JP | 2009161364 | A | | 7/2009 |
| JP | 2010280567 | A | | 12/2010 |
| JP | 2012017241 | A | * | 1/2012 |
| JP | 2012136379 | A | | 7/2012 |
| JP | 2012136400 | A | | 7/2012 |
| JP | 2019066262 | A | | 4/2019 |
| KR | 20100048913 | A | | 5/2010 |
| WO | 2018055974 | A1 | | 3/2018 |

OTHER PUBLICATIONS

An Office Action issued by the German Patent Office, mailed Mar. 26, 2024, for German counterpart application No. 112020006320.8 (6 pages).

Final Office Action issued by U.S. Patent and Trademark Office, dated Mar. 6, 2025, for U.S. related U.S. Appl. No. 17/783,616 (7 pages).

International Search Report (ISR) mailed Dec. 22, 2020, issued for International application No. PCT/JP2020/040832. (3 pages).

Non-Final Office Action issued by U.S. Patent and Trademark Office, dated Nov. 26, 2024, for U.S. related U.S. Appl. No. 17/783,616 (25 pages).

Notice of Allowance issued by U.S. Patent and Trademark Office, dated May 7, 2025, for U.S. related U.S. Appl. No. 17/783,616 (7 pages).

* cited by examiner (a)

(b)

| Crucible sample | Quartz glass crucible | | | | | | | Result of silicon single crystal pulling-up | |
|---|---|---|---|---|---|---|---|---|---|
| | Total concentration of Na, K, and Ca | | | | Arithmetic average roughness of outermost surface Ra (μm) | Outer appearance after use | | Lag time (hr) | Single crystal yield (%) |
| | Concentration peak within range of 16 to 32 μm from inner surface | Concentration ratio [II/I] | Concentration ratio [III/I] | Concentration gradient [III] (atoms/cc/μm) | | Number density of brown rings (piece/cm$^2$) | Peeling area Ratio (%) | | |
| Ex 1 (A1) | Present | 6 | 1.0 | -5.6E + 11 | 0.02 | 1 | 0 | No lag time | 82.2 |
| Ex 2 (A2) | Present | 11 | 0.8 | -2.6E + 11 | 0.03 | 2 | 0 | No lag time | 81.7 |
| Ex 3 (A3) | Present | 19 | 0.6 | -8.6E + 11 | 0.02 | 1 | 0.8 | No lag time | 87.0 |
| Ex 4 (A4) | Present | 2 | 0.8 | -8.5E + 10 | 0.02 | 1 | 8 | No lag time | 82.3 |
| Comp Ex 1 (A5) | Absent | 1 | 0.1 | -2.9E + 10 | 0.03 | 5 | 26 | 15.3 | 35.1 |
| Comp Ex 2 (A6) | Absent | 1 | 0.1 | -8.6E + 11 | 0.02 | 6 | 31 | 5.3 | 51.5 |
| Comp Ex 3 (A7) | Absent | 2 | 0.1 | -5.9E + 10 | 0.04 | 2 | 42 | No lag time | 60.5 |
| Comp Ex 4 (A8) | Absent | 21 | 0.8 | -4.3E + 10 | 0.05 | 1 | 36 | 2.9 | 45.9 |

FIG.9

MANUFACTURING METHOD OF QUARTZ GLASS CRUCIBLE

CROSS REFERENCE TO RELATED APPLICATIONS

This application is a divisional of U.S. patent application Ser. No. 17/783,616, filed Jun. 8, 2022, and claims the benefits thereof under U.S.C. § 121 or § 365(c), which is the U.S. National Phase under 35 U.S.C. § 371 of International Application PCT/JP2020/040832, filed Oct. 30, 2020, which claims priority to Japanese Patent Application No. 2019-231815, filed Dec. 23, 2019, each disclosure of which is herein incorporated by reference in its entirety. The International Application was published under PCT Article 21(2) in the language other than English. The applicant herein explicitly rescinds and retracts any prior disclaimers or disavowals made in any parent, child or related prosecution history with regard to any subject matter supported by the present application.

TECHNICAL FIELD

The present invention relates to a quartz glass crucible and manufacturing method thereof and, more particularly, to a quartz glass crucible for use in pulling-up of a silicon single crystal according to the Czochralski (CZ) method and its manufacturing method.

BACKGROUND ART

A quartz glass crucible is used in manufacturing of a silicon single crystal according to the CZ method. In the CZ method, a silicon raw material is heated in the quartz glass crucible to be melted, followed by immersing of a seed crystal into the obtained silicon melt, and the seed crystal is gradually pulled up while the crucible is rotated to grow a single crystal. To manufacture a high quality silicon single crystal for a semiconductor device at low cost, a single crystal yield in one pulling-up process needs to be increased. This requires a crucible with a stable shape that can endure prolonged use.

A recent increase in the diameter of a silicon single crystal has significantly increased a time required to pull up a single crystal. When the inner surface of a quartz glass crucible contacts a silicon melt of 1400 °C or more for a long time, it reacts with the silicon melt to be crystalized, causing ring-shaped brown cristobalite called “brown ring”. A cristobalite layer is not formed in the inside of the brown ring, or the cristobalite layer, if any, is a thin layer. The brown ring increases its area with the lapse of operation time, and the adjacent brown rings merge and grow. Finally, the center of the brown ring is corroded to expose an irregular glass-eluting surface. Once this glass eluting surface emerges, dislocations are likely to be generated in a silicon single crystal, which reduces a single crystal yield. Thus, a quartz glass crucible in which a brown ring is less likely to be generated, or a brown ring, if any, is less likely to expand is desired.

To suppress generation and growth of brown rings, for example, Patent Document 1 describes a method to form a layer highly reactive with a silicon melt in the inner layer of a quartz glass crucible so as to make an erosion speed higher than the generation speed of a crystal core to thereby reduce the number of brown rings. Further, Patent Document 2 describes a method to increase the number of brown rings being generated at a molten metal surface vibration position by applying etching or sandblasting to the molten metal surface vibration position and to reduce the number of brown rings being generated below the molten metal surface vibration position.

Further, Patent Document 3 describes a quartz glass crucible in which the OH group concentration is 90 ppm or less in a surface glass layer having a thickness of 100 μm from the inner surface of the crucible, and the OH group concentration is 90 to 200 ppm in a glass layer below the surface glass layer in the thickness direction of the crucible and extending to a depth of 1 mm from the inner surface of the crucible. That is, the OH group concentration in the surface layer on the shallower side of the crucible inner layer is reduced to reduce the dissolution rate of the quartz glass to make a state where the crystal core of a brown ring is likely to remain, and the OH group concentration in the layer below the shallower-side surface layer is increased to make a state where the crystal core is likely to grow to suppress peeling-off of the brown ring.

Further, Patent Document 4 describes that a silica glass crucible having a straight body part and a bottom portion includes an innermost layer made of an SiOx film ($0<x<2$) having a thickness of 0.5 to 200 μm, a transparent silica glass inner layer having an OH group concentration of less than 30 ppm and a thickness of 3 to 5 mm and having an area contacting the innermost layer, and an outer layer made of opaque silica glass, wherein the innermost layer serving as a sacrificial layer is previously coated on the inner surface of the crucible. Even in a case where a crystal core of cristobalite is formed on the surface of the innermost layer before polysilicon is entirely melted, generation of the cristobalite core on the inner layer surface to be exposed after dissolution of the innermost layer is suppressed when the innermost layer is dissolved in a silicon melt at a rate higher than the crystallization rate around the formation region of the cristobalite core, making it possible to suppress generation and growth of a brown ring that contributes to a reduction in a silicon single crystal yield in the pulling-up process.

BACKGROUND ART LITERATURE

Patent Literature

Patent Literature 1: Japanese Patent Application Laid-Open No. 2005-306708
Patent Literature 2: Japanese Patent Application Laid-Open No. 2005-320241
Patent Literature 3: Japanese Patent Application Laid-Open No. 2009-161364
Patent Literature 4: Japanese Patent Application Laid-Open No. 2012-136400

SUMMARY OF INVENTION

Problem to be Solved by the Invention

As described above, a brown ring is generated on the inner surface of the quartz glass crucible during the pulling-up process of the silicon single crystal. When the brown ring is peeled off from the crucible inner surface and mixed into the silicon melt, the yield of a silicon single crystal may decrease. Therefore, the peeling-off of the brown ring needs to be suppressed.

An object of the present invention is therefore to provide a quartz glass crucible capable of improving the yield of a silicon single crystal by suppressing peeling-off of brown rings and its manufacturing method.

Means for Solving the Problems

The present inventors have made intensive studies on a mechanism of generation, growth, and peeling-off of brown rings and have found that, to prevent peeling-off of brown rings, it is important to reduce the number of generated brown rings as much as possible and to stably grow brown rings that have been generated and that, by adjusting the distribution of Na, K, and Ca around the inner surface of a crucible in the depth direction, it is possible to achieve the reduction in the number of generated brown rings and stable growth of brown rings that have been generated.

The present invention has been made based on the above technical knowledge, and a quartz glass crucible for use in pulling-up of a silicon single crystal according to the present invention is characterized in that a peak of a distribution of a total concentration of Na, K, and Ca in a depth direction from an inner surface of the crucible is present at a position deeper than the inner surface. According to the present invention, the number of brown ring cores being generated on the crucible inner surface can be suppressed. Thus, it is possible to suppress growth and peeling-off of brown rings to improve the yield of a silicon single crystal.

In the quartz glass crucible according to the present invention, the peak of the total concentration of Na, K, and Ca is preferably present within a depth range of 32 μm or less from the inner surface and, more preferably, within a depth range of 16 μm or more and 32 μm or less from the inner surface. This can make the dissolution rate of the crucible inner surface higher than the growth rate of brown rings to thereby eliminate brown ring cores. Thus, it is possible to suppress growth and peeling-off of brown rings to improve the silicon single crystal yield.

In the present invention, the peak value of the total concentration of Na, K, and Ca within the range of 16 μm or more and 32 μm or less from the inner surface is preferably 2 times or more and 19 times or less an average value of the total concentration of Na, K, and Ca within a depth range of 0 μm or more and 8 μm or less from the inner surface. This can suppress generation and growth of brown ring cores.

In the present invention, an average value of the total concentration of Na, K, and Ca within a depth range of 32 μm or more and 1000 μm or less from the inner surface is preferably 0.6 times or more and 1 time or less the average value of the total concentration of Na, K, and Ca within a depth range of 0 μm or more and 8 μm or less from the inner surface. Further, a total concentration of Na, K, and Ca within a depth range of 32 μm or more and 1000 μm or less from the inner surface preferably has a negative concentration gradient with the depth direction as a positive direction and, more preferably, has a concentration gradient of $-8.2\times10^{10}$ atoms/cc/μm or less. This can suppress dissolution of the crucible inner surface to stably grow brown rings, which in turn can suppress peeling-off of brown rings from the inner surface.

A quartz glass crucible for a silicon single crystal pulling-up according to another aspect of the present invention has a first surface layer portion provided at a depth position of 0 μm or more and 16 μm or less from the inner surface, a second surface layer portion provided at a depth position of 16 μm or more and 32 μm or less from the inner surface, and a third surface layer portion provided at a depth position of 32 μm or more and 1000 μm or less from the inner surface, wherein the maximum value of the total concentration of Na, K, and Ca in the second surface layer portion is larger than the maximum value of the total concentration of Na, K, and Ca in the first surface layer portion.

According to the present invention, it is possible to suppress generation of brown ring cores on the crucible inner surface. Further, brown ring cores can be eliminated by making the dissolution rate of the crucible inner surface higher than the growth rate of brown ring cores. Thus, it is possible to suppress peeling-off of brown rings to improve the silicon single crystal yield.

In the present invention, the maximum value of the total concentration of Na, K, and Ca in the second surface layer portion is preferably 2 times or more and 19 times or less the maximum value of the total concentration of Na, K, and Ca in the first surface layer portion. This can suppress generation and growth of the brown ring core.

The maximum value of the total concentration of Na, K, and Ca in the third surface layer portion is preferably 0.6 times or more and 1 time or less the maximum value of the total concentration of Na, K, and Ca in the first surface layer portion. In this case, the total concentration gradient of Na, K, and Ca in the third surface layer portion preferably has a negative concentration gradient with the depth direction as the positive direction and, more preferably, has a concentration gradient of $-8.2\times10^{10}$ atoms/cc/μm or less. This can suppress dissolution of the crucible inner surface to stably grow brown rings, which in turn can suppress peeling-off of brown rings from the inner surface.

In the present invention, an average value of a total concentration of Li, Al, Na, K, and Ca within a depth range of 0 μm or more and 8 μm or less from the inner surface is preferably $3.6\times10^{16}$ atoms/cc or more and $5.5\times10^{17}$ atoms/cc or less. Li, Al, Na, K, and Ca have an action of promoting generation of brown ring cores, so that when Li, Al, Na, K, and Ca are present in large amount around the crucible inner surface that first contacts a silicon melt, brown ring cores are likely to be generated on the crucible inner surface, leading to a reduction in the silicon single crystal yield. However, when the total concentration of Li, Al, Na, K, and Ca within a depth range of 0 μm or more and 8 μm or less from the crucible inner surface is reduced to $5.5\times10^{17}$ atoms/cc or less, generation of the brown ring core can be suppressed to improve the silicon single crystal yield.

The quartz glass crucible according to the present invention preferably includes a transparent layer made of silica glass containing no bubbles and constituting the inner surface and a bubble layer made of silica glass containing a large number of bubbles and provided outside the transparent layer, and the thickness of the transparent layer is preferably 1 mm or more. This can prevent peeling-off of brown rings due to expansion and bursting of the bubbles in the silica glass under high temperatures during a silicon single crystal pulling-up process.

A manufacturing method of a quartz glass crucible according to the present invention includes producing a quartz glass crucible by arc-melting raw material quartz powder deposited on an inner surface of a rotating mold, washing an inner surface of the quartz glass crucible with pure water thereby reducing a total concentration of Na, K, and Ca contained in a silica glass around the inner surface as compared to that before washing, and etching the inner surface with washing liquid containing hydrofluoric acid.

According to the present invention, there can be produced a quartz glass crucible for use in pulling-up of a silicon single crystal having a peak of the total concentration of Na, K, and Ca within a depth range of 16 μm or more and 32 μm or less from the inner surface of the crucible.

In the present invention, the specific resistance of the pure water used in the washing step of the inner surface of the quartz glass crucible with the pure water is preferably 17 MΩ cm or more, the amount of water to be used per quartz glass crucible is preferably 125 liter or more, and the water temperature is preferably 45 to 99 °C. This can reduce the total concentration of Na, K, and Ca within a depth range of 0 μm or more and 8 μm or less from the inner surface and, in particular, there can be produced a quartz glass crucible in which the total concentration of Li, Al, Na, K, and Ca is $3.6\times10^{16}$ atoms/cc or more and $5.5\times10^{17}$ atoms/cc or less.

In the present invention, the amount of etching for the inner surface is preferably 5 μm or more and 10 μm or less and, whereby it is preferable to set a peak of the total concentration of Na, K, and Ca within a depth range of 16 μm or more and 32 μm or less from the inner surface. By setting the peak of the total concentration of Na, K, and Ca within a depth range of 16 μm or more and 32 μm or less from the inner surface, generation of brown ring cores in the crucible inner surface in the first half of the raw material melting step can be suppressed. Further, in the latter half of the raw material melting step, the dissolution rate of the crucible inner surface can be made higher than the growth rate of brown ring cores to thereby eliminate brown ring cores.

The quartz glass crucible according to the present invention has an effect of suppressing brown rings which may cause dislocation of a signal crystal, from being generated on the crucible inner surface. Brown rings are generated due to prolonged contact of the crucible inner surface with a high-temperature silicon melt. Thus, the quartz crucible inner surface that contacts a high-temperature silicon melt preferably has impurity properties of the present invention. In particular, the crucible bottom portion and/or corner portion that contact the high-temperature silicon melt for a long time preferably have/has the impurity properties of the present invention.

Effects of the Invention

According to the present invention, there can be provided a quartz glass crucible capable of improving the yield of the silicon single crystal by suppressing peeling-off of the brown ring and its manufacturing method.

BRIEF DESCRIPTION OF THE DRAWINGS

FIG. 9 is a table showing evaluation conditions and results for the quartz glass crucible samples A1 to A8.

MODE FOR CARRYING OUT THE INVENTION

Hereinafter, a preferred embodiment of the present invention will be described in detail with reference to the accompanying drawings.

Figure 1:
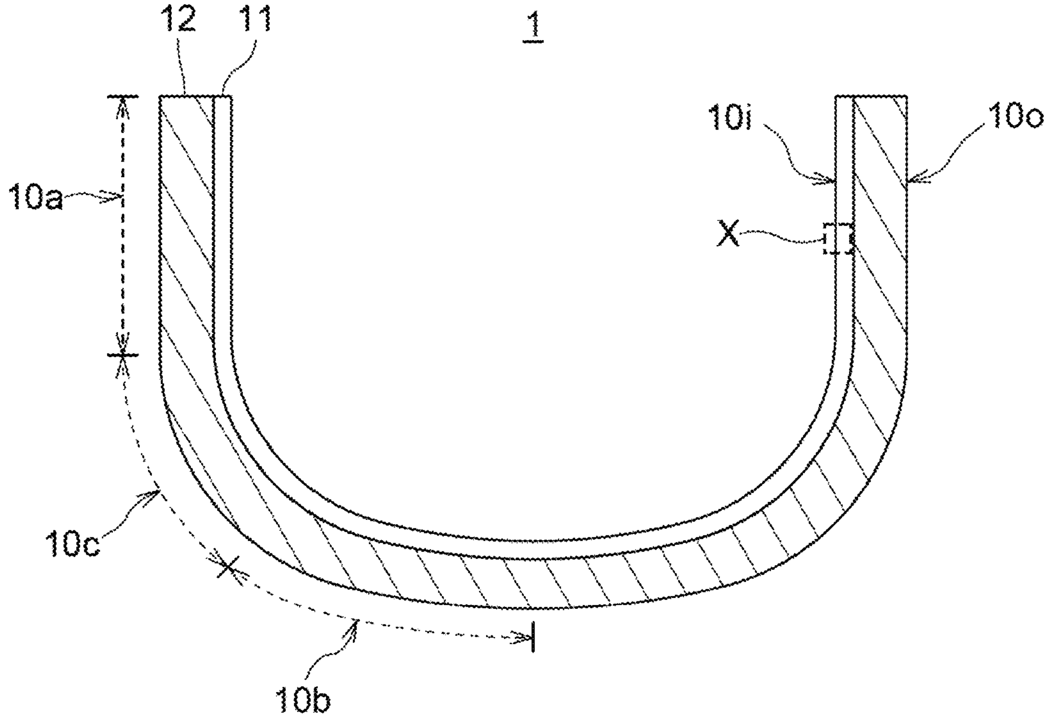
FIG. 1 is a schematic cross-sectional side view illustrating the configuration of a quartz glass crucible according to an embodiment of the present invention.

FIG. 1 is a schematic cross-sectional side view illustrating the configuration of a quartz glass crucible according to an embodiment of the present invention.

As illustrated in FIG. 1, a quartz glass crucible 1 is a silica glass container for supporting a silicon melt and has a cylindrical side wall portion 10*a*, a bottom part 10*b*, and a corner portion 10*c* arranged between the side wall portion 10*a* and the bottom portion 10*b*. The bottom portion 10*b* is preferably a so-called round bottom which is gently curved, but it may be a so-called flat bottom. The corner portion 10*c* is positioned between the side wall portion 10*a* and the bottom portion 10*b* and has a larger curvature than the bottom portion 10*b*. The boundary between the side wall portion 10*a* and the corner portion 10*c* is a position at which the side wall portion 10*a* starts to be curved. The boundary between the corner portion 10*c* and the bottom portion 10*b* is a position at which the large curvature of the corner portion 10*c* starts to be changed to the small curvature of the bottom portion 10*b*.

The diameter of the quartz glass crucible 1 is preferably 22 inches (about 560 mm) or more and, more particularly, 32 inches (about 800 mm) or more, although it varies depending on the diameter of a silicon single crystal ingot to be pulled up. Such a large-diameter crucible is preferably used for pulling up a large-sized silicon single crystal ingot having a diameter of 300 mm or more and has no adverse effects on the quality of the single crystal even with long-term usage. While the thickness of the quartz glass crucible 1 slightly varies from one portion to another, the thickness of the side wall portion 10*a* of a crucible having a diameter of 22 inches or more is preferably 7 mm or more, and the thickness of the side wall portion 10*a* of a large-sized crucible having a diameter of 32 inches or more is preferably 10 mm or more. This allows a large amount of silicon melt to be stably held under high temperatures.

The quartz glass crucible 1 has a double-layer structure and includes a transparent layer 11 made of silica glass containing no bubbles and a bubble layer 12 (opaque layer) made of silica glass containing a large number of microbubbles and provided outside the transparent layer 11.

The transparent layer 11 is a layer constituting an inner surface 10*i* of the crucible that contacts a silicon melt and is provided for preventing the single crystal yield from being reduced due to the bubbles in the silica glass. The thickness of the transparent layer 11 is preferably 1 to 12 mm and is set to an adequate value in this range for each location in the crucible so as to prevent the transparent layer 11 from being completely eliminated due to erosion during a single crystal pulling-up process and the bubble layer 12 from being exposed. Like the bubble layer 12, the transparent layer 11 is preferably formed over the entire surface of the crucible from the side wall portion 10*a* to the bottom portion 10*b*;

however, it may be omitted at the upper end portion (rim portion) of the crucible that does not contact the silicon melt.

The transparent layer 11 constitutes the inner side of the crucible and has a bubble content of 0.1 vol % or less. The phrase "containing no bubbles" in regard to the transparent layer 11 means that the transparent layer 11 has a bubble content and bubble size to the extent that does not reduce the single crystal yield. When bubbles exist in the vicinity of the inner surface of the crucible, the bubbles in the vicinity of the crucible inner surface cannot be confined within the silica glass due to erosion of the crucible inner surface. This may cause the bubbles in the silica glass to burst due to thermal expansion during a crystal pulling-up process, resulting in peel-off of crucible pieces (quartz pieces). When the crucible pieces released into the silicon melt are transported by melt convection to the growth interface of a single crystal to be entrapped into the single crystal, dislocations may be generated in the single crystal. Alternatively, when the bubbles released into the melt due to the erosion of the crucible inner surface float to the solid/liquid interface to be entrapped in the single crystal, pinholes may be generated. The average diameter of the bubbles in the transparent layer 11 is preferably 100 μm or less.

The bubble layer 12 is a layer constituting an outer surface 100 of the crucible and is provided for enhancing the heat-retaining property of the silicon melt in the crucible and for dispersing radiant heat from a heater which is provided in a single crystal pull-up unit so as to surround the crucible, so that the silicon melt in the crucible can be heated as uniformly as possible. To this end, the bubble layer 12 is formed over the entire surface of the crucible from the side wall portion 10*a* to the bottom portion 10*b*. The thickness of the bubble layer 12 is, although it varies from one portion to another in the crucible, equal to a value obtained by subtracting the thickness of the transparent layer 11 from the thickness of the crucible.

The bubble content of the bubble layer 12 is higher than that of the transparent layer 11 and is preferably more than 0.1 vol % and 5 vol % or less, and more preferably 1 vol % or more and 4 vol % or less. When the bubble content of the bubble layer 12 is 0.1 vol % or less, the bubble layer 12 cannot exhibit the required heat-retaining function. In addition, when the bubble content of the bubble layer 12 exceeds 5 vol %, the crucible could be deformed due to expansion of the bubbles, which may reduce the single crystal yield, and heat conductivity would become insufficient. In particular, when the bubble content of the bubble layer 12 falls within the range of 1 to 4%, a good balance is maintained between heat retaining property and heat conductivity. The bubble content of the bubble layer 12 can be calculated by measuring the specific gravity of, for example, an opaque silica glass piece cut out from the crucible.

To prevent contamination of the silicon melt, the silica glass constituting the transparent layer 11 preferably has high purity. Therefore, the quartz glass crucible 1 according to the present embodiment is preferably constituted by two layers of a synthetic quartz glass layer formed from synthetic quartz powder and a natural quartz glass layer formed from natural quartz powder. The synthetic quartz powder can be produced by means of a vapor phase oxidation (dry synthesis method) of silicon tetrachloride ($SiCl_4$), or hydrolysis of silicon alkoxide (Sol-Gel method). The natural quartz powder is quartz powder produced by pulverizing natural mineral mainly composed of α-quartz.

Although details will be described later, the two-layer structure of the synthetic quartz glass layer and natural quartz glass layer can be produced by depositing the natural quartz powder along the inner surface of a mold for producing a crucible, depositing the synthetic quartz powder on the deposited natural quartz powder, and melting the thus deposited quartz powder layers by using Joule heat of arc discharge. In the initial stage of the arc melting, bubbles are removed by performing strong evacuation from outside of the deposited layer of the quartz powder to form the transparent layer 11. After that, the evacuation is stopped or weakened to form the bubble layer 12 outside the transparent layer 11. Therefore, the boundary between the synthetic quartz glass layer and the natural quartz glass layer does not necessarily coincide with the boundary between the transparent layer 11 and the bubble layer 12; however, like the transparent layer 11, the synthetic quartz glass layer preferably has such a thickness as not to be completely eliminated due to erosion of the crucible inner surface during a crystal pulling-up process.

Figure 2:
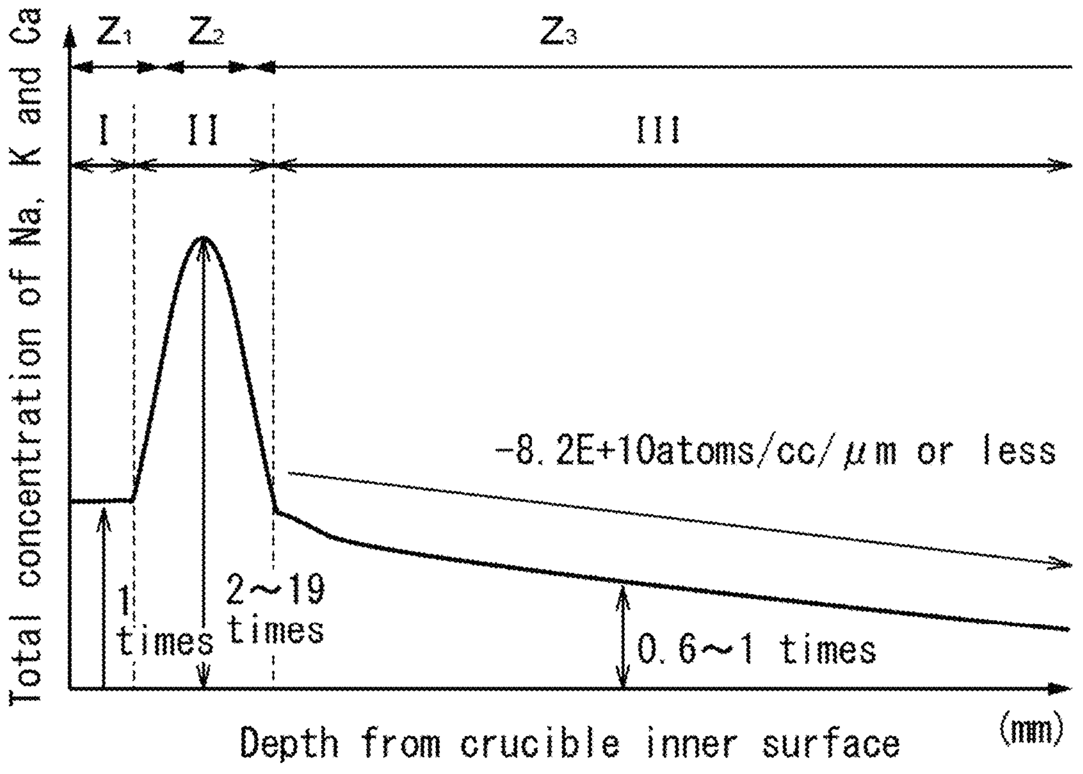
FIG. 2 is a graph illustrating a change in the depth direction in the total concentration of Na, K, and Ca contained in the silica glass in a surface layer portion on the inner surface side of the quartz glass crucible of FIG. 1.

FIG. 2 is a graph illustrating a change in the depth direction in the total concentration of Na, K, and Ca contained in the silica glass in a surface layer portion X on the inner surface 10*i* side of the quartz glass crucible 1 of FIG. 1. The horizontal axis indicates a position in the depth direction from the inner surface 10*i* of the crucible, and the vertical axis indicates the total concentration of Na, K, and Ca.

As illustrated in FIG. 2, the quartz glass crucible 1 according to the present embodiment is featured in that the impurity concentration of a first surface layer portion $Z_1$ at the depth position of 0 to 16 μm from the inner surface 10*i* of the crucible is relatively low, the impurity concentration of a second surface layer portion $Z_2$ at the depth position of 16 to 32 μm from the inner surface 10*i* is relatively high, and the impurity concentration of a third surface layer portion $Z_3$ at the depth position of 32 to 1000 μm from the inner surface 10*i* is relatively low. The depth direction distribution of the total concentration of Na, K, and Ca contained in the silica glass constituting the crucible does not have a peak at the position of the inner surface 10*i* of the crucible but has a peak within the depth range of 32 μm or less from the inner surface 10*i*, and more preferably, within a depth range of 16 to 32 μm from the inner surface 10*i*. The peak value of the total concentration of Na, K, and Ca within a depth range of 16 to 32 μm from the inner surface 10*i* is 2 to 19 times the average value of the total concentration of Na, K, and Ca within a depth range of 0 to 8 μm from the inner surface 10*i*.

The first surface layer portion $Z_1$ at the depth position of 0 to 16 μm from the inner surface 10*i* of the crucible is a layer that first contacts the silicon melt. In the first half (I) of a raw material melting step in which the first surface layer portion $Z_1$ contacts the silicon melt, many cristobalite cores are generated on the inner surface 10*i* of the crucible. Metal impurities such as Li, Al, Na, K, and Ca, which abide in the vicinity of the crucible inner surface contribute to the generation of brown ring cores and may cause more brown rings to be generated. Thus, the average value of the total concentration of Li, Al, Na, K, and Ca within a depth range of 0 to 8 μm from the inner surface 10*i* of the crucible is preferably $3.6\times10^{16}$ atoms/cc or more and $5.5\times10^{17}$ atoms/cc or less. This can reduce the number of generated brown ring cores.

The inner surface 10*i* having a reduced concentration of impurities such as Na needs to be formed particularly at the bottom portion 10*b* and/or corner portion 10*c* of the quartz glass crucible 1. This is because the bottom portion 10*b* and corner portion 10*c* of the quartz glass crucible 1 contact the silicon melt for a longer period of time than do the side wall portion 10*a* and are thus likely to generate the brown ring.

The side wall portion 10*a* may have or may not have the inner surface 10*i* having a reduced concentration of impurities such as Na.

The inner surface 10*i* of the crucible is preferably as smooth as possible. In particular, the inner surface 10*i* of the bottom portion 10*b* preferably has an arithmetic average roughness Ra of 0.02 to 0.3 μm. This can reduce the number of generated brown ring cores in the first half (I) of the raw material melting step.

The number of generated brown ring cores abruptly decreases after peaking at some point and, after that, a growth stage of brown ring cores is entered. Thus, afterwards, the number of generated brown ring cores does not significantly increase even when the total concentration of Na, K, and Ca is somewhat high. In the latter half (II) of the raw material melting step, the core gradually grows to generate brown rings. However, when the peak value of the total concentration of Na, K, and Ca within a depth range of 16 to 32 μm from the inner surface 10*i* is set to 2 to 19 times the average value (reference concentration) of the total concentration of Na, K, and Ca within a depth range of 0 to 8 μm from the inner surface 10*i*, brown ring cores can be eliminated by making the dissolution rate of the inner surface 10*i* higher than the growth rate of brown ring cores.

It is known that Na, K, and Ca contained in the silica glass promote dissolution of the silica glass. In the present embodiment, the total concentration of Na, K, and Ca within a depth range of 16 to 32 μm from the inner surface 10*i* is made relatively high, so that the dissolution rate of the inner surface 10*i* can be made higher than the growth rate of brown rings. This allows brown ring cores to be eliminated before they grow larger, whereby the brown ring core can be removed.

As described above, by making the total concentration of Na, K, and Ca in the first surface layer portion $Z_1$ relatively low and making the total concentration of Na, K, and Ca in the second surface layer portion $Z_2$ relatively high, the number of brown rings can be reduced to some degree. However, it is difficult to completely eliminate brown rings, and some brown rings are generated on the inner surface 10*i* of the crucible. During a silicon single crystal pulling-up process (III), brown rings grow larger, increasing a risk of peeling-off of the brown rings. In the present embodiment, the average value of the total concentration of Na, K, and Ca within a depth range (32 to 1000 μm) of deeper than 32 μm from the inner surface 10*i* is 0.6 to 1 times the reference concentration, so that dissolution of the inner surface 10*i* during the single crystal pulling-up process can be suppressed. Further, the total concentration of Na, K, and Ca within a depth range of 32 to 1000 μm from the inner surface 10*i* of the crucible has a negative concentration gradient of $8.2\times10^{10}$ atoms/cc/μm or less with the depth direction as the positive direction, so that it is possible to stably grow brown rings while suppressing an abrupt change in the total concentration of Na, K, and Ca, whereby peeling-off of brown rings can be suppressed.

Figure 3:
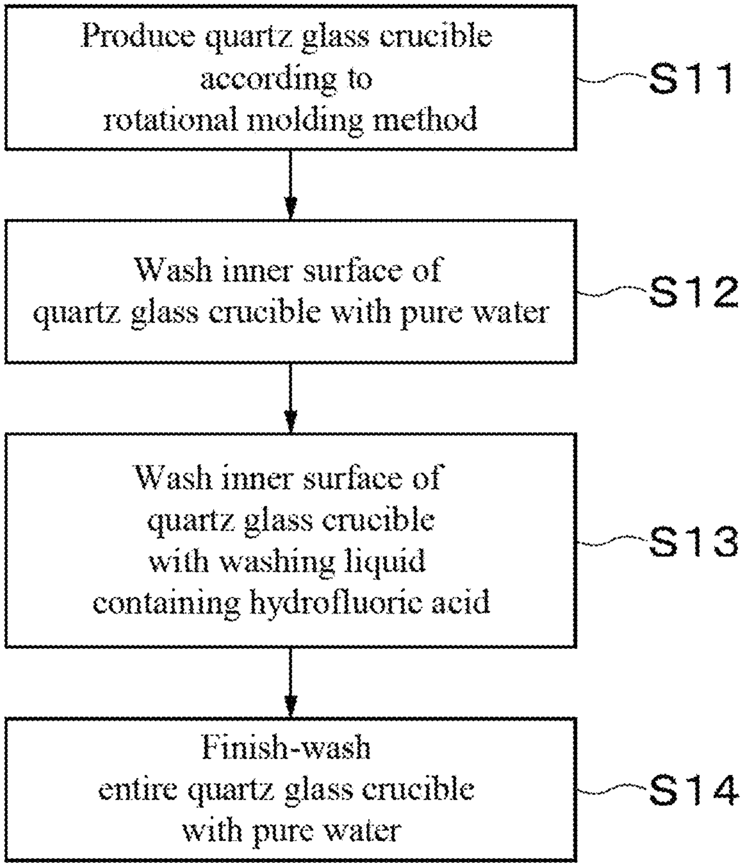
FIG. 3 is a flowchart illustrating a manufacturing method of the quartz glass crucible.
Figure 4:
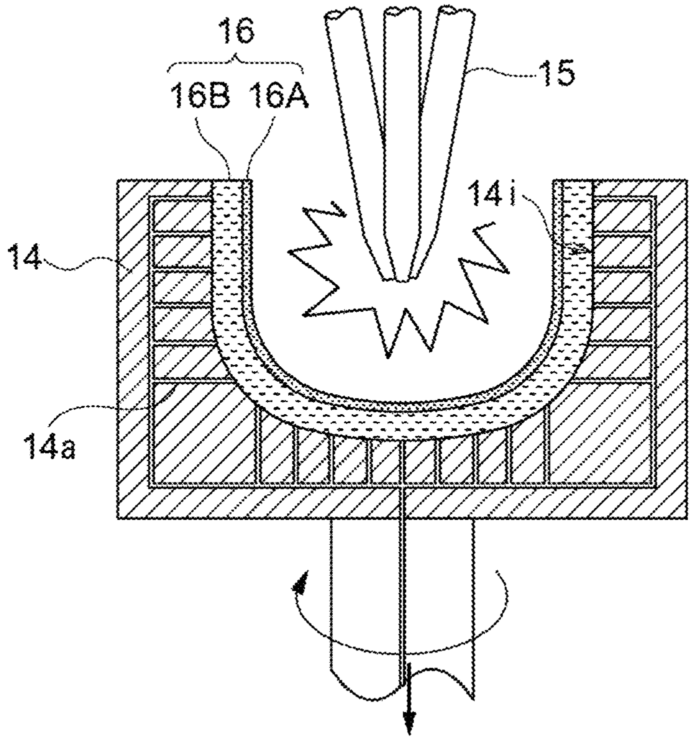
FIG. 4 is a schematic view for explaining the manufacturing method of the quartz glass crucible according to a rotational molding method.

FIG. 3 is a flowchart illustrating a manufacturing method of the quartz glass crucible 1. FIG. 4 is a schematic view for explaining the manufacturing method of the quartz glass crucible 1 according to a rotational molding method. Also, FIGS. 5(*a*) to 5(*c*) are graphs for explaining the manufacturing method of the quartz glass crucible 1 and each specifically illustrates impurity concentration distribution in the depth direction from the inner surface 10*i*.

In the manufacture of the quartz glass crucible 1, the quartz glass crucible 1 is first produced by a rotational molding method (step S11) as illustrated in FIG. 3 and FIG. 4. In the rotational molding method, a mold 14 having a cavity corresponding to the outer shape of the crucible is prepared, and natural quartz powder 16B and synthetic quartz powder 16A are serially deposited along an inner surface 14*i* of the rotating mold 14 to form a deposited layer 16 of raw material quartz powder. Only natural quartz powder 16B may be used as the material of the crucible. The raw material quartz powder is retained at a certain position of the inner surface 14*i* of the mold 14 by centrifugal force, and the crucible shape is maintained. By changing the thickness of the deposited layer 16 of raw material quartz powder, the crucible thickness can be adjusted at each location.

Then, arc electrodes 15 are placed in the mold 14, and the deposited layer 16 of the raw material quartz powder is arc-melted from the inner surface 14*i* side of the mold 14. Specific conditions such as heating time and heating temperature need to be determined in consideration of conditions including raw material and size of the crucible. At this time, the deposited layer 16 of the raw material quartz powder is subjected to suction through many vent holes 14*a* formed in the inner surface 14*i* of the mold 14 to control the amount of bubbles in melted glass. Specifically, suction force through the many vent holes 14*a* formed in the inner surface 14*i* of the mold 14 is increased at the start time of the arc melting to form the transparent layer 11, and then the suction force is reduced after formation of the transparent layer 11 to form the bubble layer 12.

The arc heat is gradually transmitted outward from the inner side of the deposited layer 16 of the raw material quartz powder to melt the raw material quartz powder, so that by changing decompression conditions at the time at which the raw material quartz powder starts to be melted, the transparent layer 11 and the bubble layer 12 can be separately formed. By conducting decompression melting for increasing decompression at the time at which the silica powder melts, the arc atmosphere gas is not confined in the glass, and silica glass containing no bubbles is formed. In addition, when normal melting (atmospheric pressure melting) is performed to weaken decompression at the time at which the raw material quartz powder is melted, the arc atmosphere gas is confined in the glass, and silica glass containing a large number of bubbles is formed. By changing, for example, the arrangement of the arc electrodes 15 or current applied thereto during the decompression melting or normal melting to partly change the degree of melting, the thickness of the transparent layer 11 or bubble layer 12 can be adjusted at each location.

Figure 5:
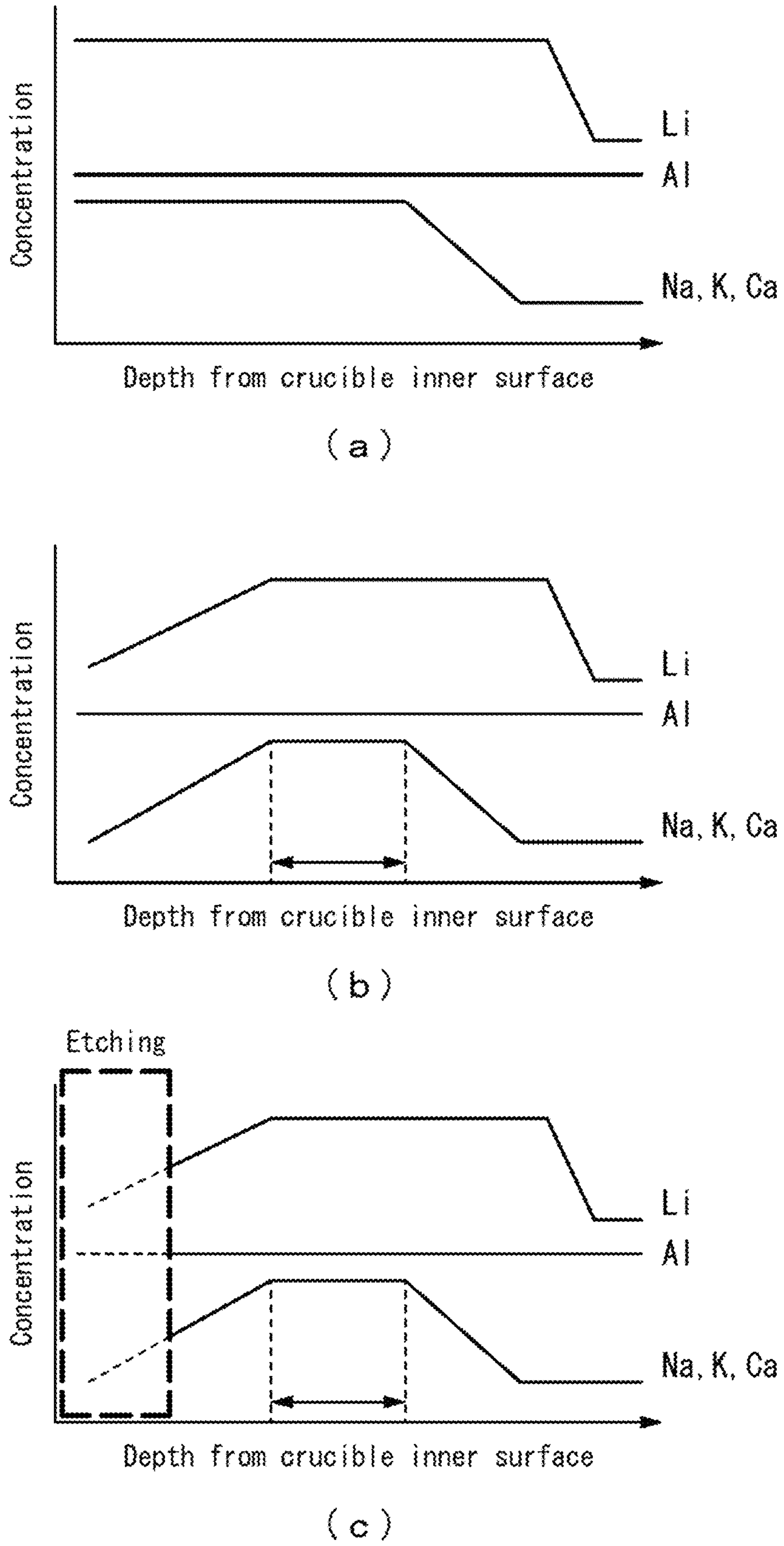
FIGS. 5 (*a*) to (*c*) are graphs for explaining the manufacturing method of the quartz glass crucible and each specifically illustrates impurity concentration distribution in the depth direction from the crucible inner surface.

Thereafter, the arc heating is ended, and the crucible is cooled down, whereby the quartz glass crucible 1 in which the transparent layer 11 and bubble layer 12 are sequentially provided from the inside toward the outside of the crucible wall is completed. In the thus obtained quartz glass crucible 1 after the arc melting (before washing), impurity concentration distribution in the depth direction from the inner surface 10*i* is as illustrated in FIG. 5(*a*), and impurity elements are concentrated at the inner surface 10*i* of the crucible. At this time, Li has an atomic radius smaller than those of other impurity elements and easily moves in the glass. Thus, Li migrates to the inner surface 10*i* side of the crucible that is close to the arc electrode side to be concentrated at a high level and in a wide area in the depth direction. Also, Al oxide ($Al_2O_3$) has a boiling point higher than those of oxides of other impurity elements and is likely to remain at the inner surface 10*i* of the crucible even after sublimation of quartz to be concentrated at a high level and in a wide area in the depth direction like Li.

Then, the inner surface 10*i* of the quartz glass crucible 1 is washed with pure water (step S12). The specific resistance of the pure water used at this time is preferably 17 MΩ cm or more, and the flow rate thereof is preferably 50 to 60 L/min. The amount of water to be used per one quartz glass crucible 1 is preferably 125 liter or more (125 liter per crucible), and the water temperature is preferably 45 to 99 °C. Under these conditions, Li, Na, K, and Ca, which are easily dissolved into pure water, are eluted from the vicinity of the inner surface 10*i* of the crucible to reduce the impurity concentration in the silica glass as compared to that before washing. As a result, the impurity concentration distribution in the depth direction from the inner surface 10*i* of the quartz glass crucible 1 becomes as illustrated in FIG. 5(*b*), and thus the concentrations of Na, K, and Ca on the inner surface 10*i* of the crucible can be reduced. The Al concentration exhibits no significant change and is maintained at an approximately constant value in the depth direction. The range in the vicinity of the inner surface 10*i* in which the concentration of impurities such as Li is determined based in relation to the degree of etching at the inner surface 10*i* and is, although not particularly limited, preferably defined between 0 and 26 μm (narrowest range) from the inner surface 10*i* or between 0 and 37 μm (widest range) from the inner surface 10*i*.

The water temperature of the pure water used in the pure water washing is preferably 45 to 99 °C and, particularly preferably 55 to 65 °C in consideration of ease of handling and safety. When the temperature of the pure water is about 25 to 35 °C, the effect of reducing the total concentration of Li, Na, K, and Ca on the inner surface 10*i* of the crucible cannot be obtained. When the pure water is intentionally heated to 45 °C or more, it is possible to elute Li, Na, K, and Ca from the inner surface 10*i* of the crucible to thereby reduce the concentration of impurities in the silica glass. Thus, by using high-temperature pure water, impurities in the crucible inner surface can be dissolved into the pure water to be washed out, thus allowing the peak of the impurity concentration to be formed in an area slightly deeper than the outermost surface.

Then, the inner surface 10*i* of the quartz glass crucible 1 is etched using washing liquid containing hydrofluoric acid to remove the surface layer portion of the crucible inner surface 10*i* (step S13). The degree of etching at the inner surface at this time is preferably 5 to 10 μm. With this etching, the inner surface 10*i* of the crucible can be cleaned, and the impurity concentration distribution in the depth direction from the inner surface 10*i* of the quartz glass crucible 1 is as illustrated in FIG. 5 (*c*). That is, the peak position of the total concentration of Na, K, and Ca can be adjusted within a range of 16 to 32 μm from the inner surface 10*i*. In the hydrofluoric acid washing, by adjusting (increasing or reducing) the washing time, the degree of etching at the inner surface 10*i* of the crucible can be changed, which allows the peak position and peak level of the impurity concentration to be adjusted.

Finally, the quartz glass crucible 1 is entirely finish-washed with pure water (step 14). In this finish washing, it is necessary to carry out pure water washing under the condition that the peak position of the total concentration of Na, K, and Ca does not significantly change. This involves a reduction in the washing time and water temperature to suppress elution of Na, K, and Ca. Through the above-described steps, the quartz glass crucible 1 according to the present embodiment is completed.

Typically, in the quartz glass crucible 1 produced by arc melting, impurity concentration is highest on the inner surface 10*i* due to the surface condensation effect. Thus, by the action of the impurities, brown ring cores are likely to be generated at the crucible inner surface, and the generated brown ring cores are likely to grow. However, in the present embodiment, the peak position of the total concentration of Na, K, and Ca contributing to generation of brown ring cores and dissolution of the crucible is shifted to a deeper position than the crucible inner surface, so that the number of generated brown ring cores can be reduced, and the generated brown ring cores can be removed. Thus, a probability of peeling-off of the brown ring during the silicon single crystal pulling-up process can be reduced to improve the single crystal yield.

Figure 6:
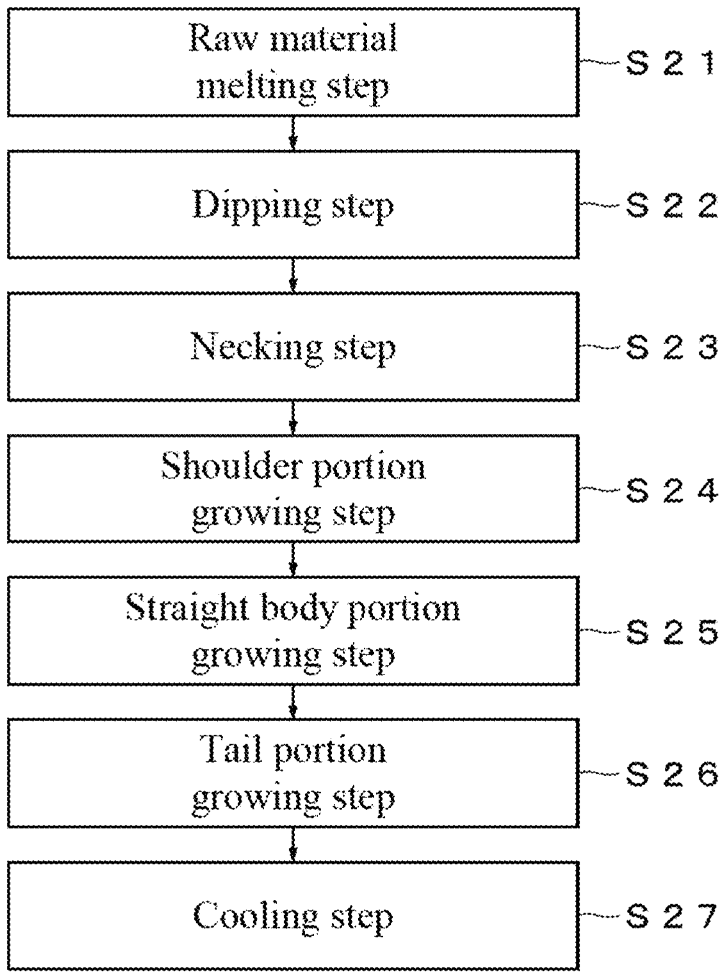
FIG. 6 is a flowchart illustrating a silicon single crystal pulling-up process according to the CZ method using the quartz glass crucible.

FIG. 6 is a flowchart illustrating a silicon single crystal pulling-up process according to the CZ method using the quartz glass crucible 1.

As illustrated in FIG. 6, the silicon single crystal pulling-up process includes a raw material melting step S21 in which polysilicon raw material in the quartz glass crucible 1 is melted to generate a silicon melt, a dipping step S22 in which a seed crystal is dipped into the silicon melt and is left standing as it is for a certain period of time so as to adapt to the silicon melt, a necking step S23 in which the diameter of the crystal is narrowed so as to eliminate dislocation occurring in the seed crystal due to heat impact or the like, a shoulder section growing step S24 in which the crystal diameter is gradually increased so as to obtain a single crystal having a predetermined diameter (e.g., about 300 mm), a straight body portion growing step S25 in which the predetermined crystal diameter is maintained, a tail section growing step S26 in which the crystal diameter is narrowed for termination of the pulling-up to separate the single crystal from the melt surface, and a cooling step S27 in which the single crystal separated from the silicon melt is cooled.

In the first half of the raw material melting step S21, brown ring cores are generated on the inner surface 10*i* of the quartz glass crucible 1 that contacts the silicon melt. However, in the quartz glass crucible 1 according to the present embodiment, the total concentration of Na, K, and Ca within a depth range (in the first surface layer portion $Z_1$) of 0 to 8 μm from the crucible inner surface 10*i* is low, which can reduce the number of brown ring cores being generated in the first half of the raw material melting step S21.

In the latter half of the raw material melting step S21, the brown ring core grows larger. However, in the quartz glass crucible 1 according to the present embodiment, the total concentration of Na, K, and Ca within a depth range (in the second surface layer portion $Z_2$) of 16 to 32 μm from the crucible inner surface 10*i* is high, and the peak value of the total concentration of Na, K, and Ca in the second surface layer portion $Z_2$ is 2 to 19 times the average value of the total concentration of Na, K, and Ca in the first surface layer portion $Z_1$, so that it is possible to promote dissolution of the crucible inner surface 10*i* to make the dissolution rate of the crucible inner surface 10*i* higher than the growth rate of brown rings. Thus, the brown ring cores generated in the first half of the raw material melting step can be removed to reduce the number of brown rings being generated.

During the growing step of the silicon single crystal from the necking step S23 to the tail section growing step S26, brown rings may not only grow but also partly be peeled off. When some brown rings are transported by melt convection to the solid/liquid interface, dislocations may be generated in the silicon single crystal. However, the total concentration of Na, K, and Ca within a depth range (in the third surface layer portion $Z_3$) of 32 to 1000 μm from the crucible inner surface 10*i* is low, and the average value of the total concentration of Na, K, and Ca in the third surface layer portion $Z_3$ is 0.6 to 1 times the average value of the total concentration of Na, K, and Ca in the first surface layer portion $Z_1$, so that excessive dissolution of the crucible inner surface 10*i* can be suppressed. Further, the total concentration of Na, K, and Ca in the third surface layer portion $Z_3$ exhibits a small change and, in particular, has a gradient of $-8.2\times10^{10}$ atoms/cc/μm or more and less than 0 atoms/cc/μm, so that it is possible to suppress peeling-off of brown ring due to an abrupt change in the state of the crucible inner surface 10*i*.

While the preferred embodiment of the present invention has been described, the present invention is not limited to the above embodiment, and various modifications may be made within the scope of the present invention, and all such modifications are included in the present invention.

EXAMPLES

Samples A1 to A8 of 32-inch quartz glass crucibles were prepared. The quartz glass crucibles were produced by a rotational molding method as described above, followed by pure water washing, hydrofluoric acid washing, and finish washing in this order. As described above, in the pure water washing, the specific resistance of the pure water was set to 17 MΩ cm or more, and the flow rate thereof was to 50 to 60 L/min. The amount of water to be used per quartz glass crucible was set to 150 liters, and the water temperature was to 55 to 65 °C. In the hydrofluoric acid washing, the degree of etching at the inner surface was set to about 8 μm. The distribution (peak position and concentration ratio of the total concentration) in the depth direction of the total concentration of Na, K, and Ca around the crucible inner surface was adjusted by changing the hydrofluoric acid washing time (etching amount).

Then, the arithmetic average roughness Ra (μm) of the inner surface was measured for each of the quartz glass crucible samples A1 to A8. Further, to evaluate the impurity concentration of a top surface layer portion of the quartz glass crucible inner surface, a sample of a silica glass piece in the top surface layer portion was taken by an SAICAS (Surface And Interfacial Cutting Analysis System) method.

Figure 7:
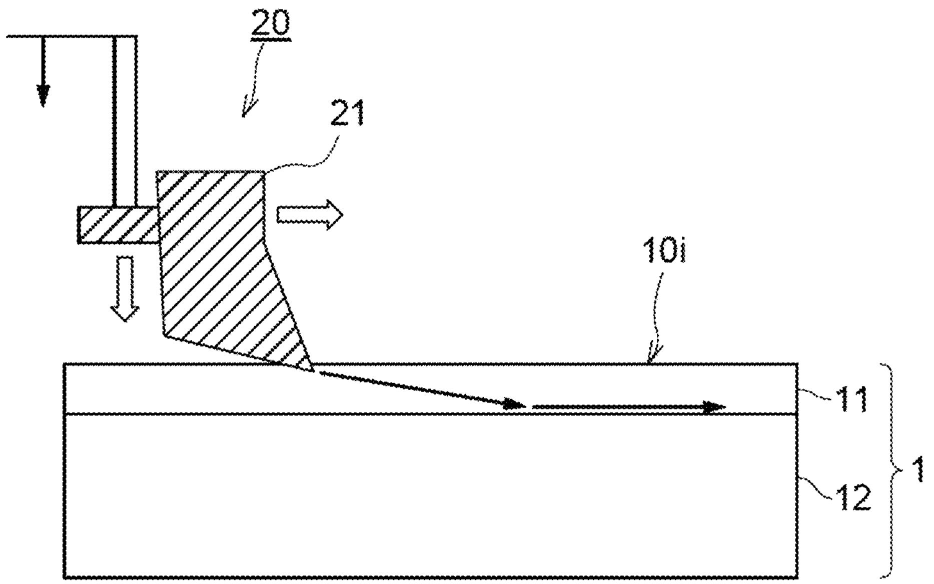
FIG. 7 is a schematic view illustrating the principle of the SAIKAS method.

FIG. 7 is a schematic view illustrating the principle of the SAIKAS method.

As illustrated in FIG. 7, in the SAICAS method, an oblique cutting apparatus 20 is used, and a cutting blade 21 is moved in a horizontal direction $D_x$ and a vertical direction $D_Y$ to obliquely thinly scrape the top surface layer portion on the inner surface 10*i* side of the quartz glass crucible 1, thereby taking the silica glass piece. This can increase an area for detecting the impurity concentration using D-SIMS to be described later to improve detection sensitivity. Thus, the impurity concentration distribution of the top surface layer portion of the quartz glass crucible 1 can be analyzed with high sensitivity.

Figure 8:
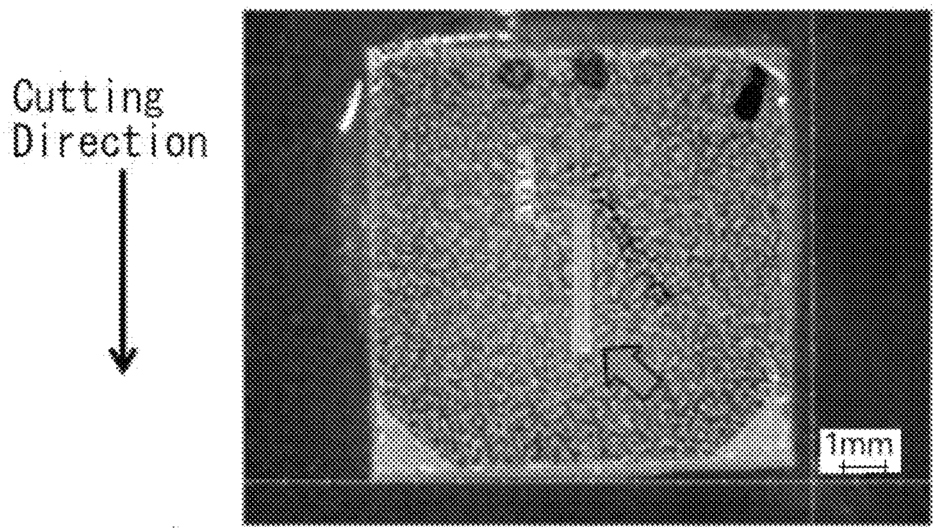
FIGS. 8 (*a*) and (*b*) are images of a silica glass piece taken according to the SAICAS method, in which FIG. 8 (*a*) illustrates a portion of the crucible inner surface after cutting of the silica glass piece, and FIG. 8 (*b*) illustrates the silica glass piece cut out from the crucible inner surface.
Figure 8:
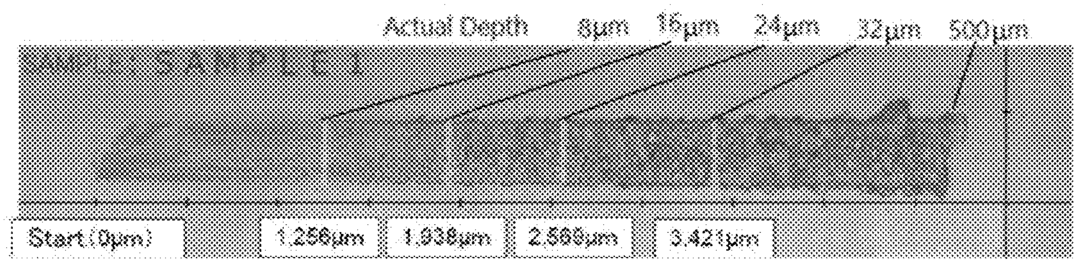

FIGS. 8(*a*) and (*b*) are images of the silica glass piece taken according to the SAICAS method. FIG. 8(*a*) illustrates a portion of the crucible inner surface after the cutting of the silica glass piece and FIG. 8(*b*) illustrates the silica glass piece cut out from the crucible inner surface. The width of the silica glass piece is about 50 μm, the length thereof is about 500 μm, and cutting depth is about 50 μm. Thus, the silica glass piece as a sample is very slender and thin.

Then, the total concentration of Na, K, and Ca contained in the silica glass piece of each of the quartz glass crucible samples A1 to A8 was measured according to D-SIMS (Dynamic-Secondary Ion Mass Spectrometry). The impurity concentration was measured, using the sample illustrated in FIG. 8(*b*), at the depth position of 0 to 8 μm (a portion of the first surface layer portion $Z_1$) from the crucible inner surface, at the depth position of 16 to 32 μm (second surface layer portion $Z_2$), and at the depth position of 32 to 500 μm (third surface layer portion $Z_3$). After that, the total concentration ratio ([II/I]) of Na, K, and Ca, the total concentration ratio ([III/I]) of Na, K, and Ca, and the total concentration gradient of Na, K, and Ca in the third surface layer portion $Z_3$ were obtained by calculation. It should be noted that the total concentration ratio ([II/I]) of Na, K, and Ca is a ratio of the peak value (II) of the total concentration in the second surface layer portion $Z_2$ to the average value (I) of the total concentration of Na, K, and Ca within a depth range of 0 to 8 μm from the crucible inner surface. Also the total concentration ratio ([III/I]) of Na, K, and Ca is a ratio of the average value (III) of the total concentration in the third surface layer portion $Z_3$ to the average value (I) of the total concentration of Na, K, and Ca within a depth range of 0 to 8 μm from the crucible inner surface.

Then, other quartz glass crucible samples produced under the same conditions as the samples A1 to A8 were prepared, and a silicon single crystal was actually pulled up therein. After that, the number density (the number of brown rings/$cm^2$) of brown rings generated on the inner surface of the quartz glass crucible was evaluated. In addition, a lag time (hr) for the silicon single crystal and a single crystal yield (%) were evaluated. It should be noted that the lag time (hr) refers to a time difference between the start time of the necking step for the first time and the start time of the necking step for the last time for producing one silicon single crystal. If the single crystal is produced normally, without doing the single crystal pulling-up over again, the lag time is 0 hr. The single crystal yield refers to a value calculated by (single crystal weight after cylindrical grinding)/(silicon raw material weight)×100%.

FIG. 9 is a table showing evaluation conditions and results for the quartz glass crucible samples A1 to A8.

As illustrated in FIG. 9, in examples 1 to 4 (samples A1 to A4), the concentration ratio ([II/I]) in the second surface layer portion $Z_2$ was 2 to 19, the concentration ratio ([III/I]) in the third surface layer portion $Z_3$ was 0.6 to 1.0, and the concentration gradient in the third surface layer portion $Z_3$ was $-8.5\times10^{10}$ atoms/cc/μm to $-8.6\times10^{11}$ atoms/cc/μm. Also the arithmetic average roughness of the inner surface at the crucible bottom portion was 0.02 to 0.03 μm. Further, in the used crucibles after pulling-up of the silicon single crystal, the number density of brown rings on the crucible inner surface was 2/$cm^2$ or less, and a peeling area ratio was 8% or less. Thus, generally good results were obtained. Further, in the results of the silicon single crystal pulling-up, no lag time occurred, and the single crystal yield was 80% or more.

In comparative example 1 (sample A5), the concentration ratio ([II/I]) in the second surface layer portion $Z_2$ was 1, the concentration ratio ([III/I]) in the third surface layer portion $Z_3$ was 0.1, and the concentration gradient in the third surface layer portion $Z_3$ was $-2.9\times10^{10}$ atoms/cc/μm. Also the arithmetic average roughness of the outermost surface was 0.03 μm. Further, in the used crucibles after pulling-up of the silicon single crystal, the number density of brown rings on the crucible inner surface was 5/$cm^2$, and peeling area ratio was 26%. Further, in the results of the silicon single crystal pulling-up, the lag time was 15.3 hrs, and the single crystal yield was 35.1%. In the sample A5, the total concentration of Na, K, and Ca in the second surface layer portion $Z_2$ is relatively low, and the total concentration of Na, K, and Ca in the third surface layer portion $Z_3$ was very low, and thus, it is considered that the number of generated brown rings and peeling area ratio of brown rings increased, leading to dislocation of the single crystal.

In comparative example 2 (sample A6), the concentration ratio ([II/I]) in the second surface layer portion $Z_2$ was 1, the concentration ratio ([III/I]) in the third surface layer portion $Z_3$ was 0.1, and the concentration gradient in the third surface layer portion $Z_3$ was $-8.6\times10^{11}$ atoms/cc/μm. Also the arithmetic average roughness of the outermost surface was 0.02 μm. Further, in the used crucibles after pulling-up of the silicon single crystal, the number density of brown rings on the crucible inner surface of was 6/cm$^2$, and peeling area ratio was 31% or less. Further, in the results of the silicon single crystal pulling-up, the lag time was 5.3 hrs, and the single crystal yield was 51.5%. In the sample A6 as well, the total concentration of Na, K, and Ca in the second surface layer portion $Z_2$ was relatively low, and the total concentration of Na, K, and Ca in the third surface layer portion $Z_3$ was very low, and thus, it is considered that the number of generated brown rings and peeling area ratio of brown rings increased, leading to dislocation of the single crystal.

In comparative example 3 (sample A7), the concentration ratio ([II/I]) in the second surface layer portion $Z_2$ was 2, the concentration ratio ([III/I]) in the third surface layer portion $Z_3$ was 0.1, and the concentration gradient in the third surface layer portion $Z_3$ was $-5.9\times10^{10}$ atoms/cc/μm. Also the arithmetic average roughness of the outermost surface was 0.04 μm. Further, in the used crucibles after pulling-up of the silicon single crystal, the number density of the brown rings on the crucible inner surface was 2/cm$^2$, and peeling area ratio was 42%. Further, in the results of the silicon single crystal pulling-up, no lag time occurred, but the single crystal yield was 60.5%. In the sample A7, the total concentration of Na, K, and Ca in the third surface layer portion $Z_3$ was very low, and thus, it is considered that the peeling area ratio increased, leading to dislocation of the single crystal.

In comparative example 4 (sample A8), the concentration ratio ([II/I]) in the second surface layer portion $Z_2$ was 21, the concentration ratio ([III/I]) in the third surface layer portion $Z_3$ was 0.8, and the concentration gradient in the third surface layer portion $Z_3$ was $-4.3\times10^{10}$ atoms/cc/μm. Also the arithmetic average roughness of the outermost surface was 0.05 μm. Further, in the used crucibles after pulling-up of the silicon single crystal, the number density of brown rings on the crucible inner surface was 1/cm$^2$, and peeling area ratio was 36%. Further, in the results of the silicon single crystal pulling-up, the lag time was 2.9 hrs, but the single crystal yield was 45.9%. In the sample A8, the total concentration of Na, K, and Ca in the second surface layer portion $Z_2$ was relatively excessively high, and thus, it is considered that the number of generated brown rings and peeling area ratio increased, leading to dislocation of the single crystal.

REFERENCE SIGNS LIST

1: Quartz glass crucible
10*a*: Side wall portion
10*b*: Bottom portion
10*c*: Corner portion
10*i*: Inner surface
100: Outer surface
11: Transparent layer
12: Bubble layer
14: Mold
14*i*: Mold inner surface
14*a*: Vent hole
15: Arc electrode
16: Deposited layer
16A: Synthetic quartz powder
16B Natural quartz powder
20: Oblique cutting apparatus
21: Cutting blade
S11: Crucible producing step
S12: Pure water washing step
S13: Hydrofluoric acid washing (etching) step
S14: Finish washing step
S21: Raw material melting step
S22: Dipping step
S23: Necking step
S24: Shoulder portion growing step
S25: Straight body portion growing step
S26: Tail portion growing step
S27: Cooling step
X: Surface layer portion
$Z_1$: First surface layer portion
$Z_2$: Second surface layer portion
$Z_3$: Third surface layer portion

What is claimed:

1. A manufacturing method of a quartz glass crucible comprising in the following order:

(i) producing an initial quartz glass crucible by arc-melting raw material quartz powder deposited on an inner surface of a rotating mold;

(ii) washing an inner surface of the initial quartz glass crucible with pure water thereby reducing a total concentration of Na, K, and Ca contained in a silica glass around the inner surface as compared to that before washing; and (iii) etching the inner surface with washing liquid containing hydrofluoric acid, thereby producing the quartz glass crucible, wherein, in step (ii), a specific resistance of the pure water used in the washing of the inner surface is 17 MΩ cm or more, an amount of the pure water to be used per quartz glass crucible is 125 liters or more, and a temperature of the pure water is 55 to 99 °C.

2. The manufacturing method of a quartz glass crucible according to claim 1, wherein in step (iii), a degree of etching at the inner surface is 5 μm or more and 10 μm or less and, whereby a peak of the total concentration of Na, K, and Ca is set within a depth range of 16 μm or more and 32 μm or less from the inner surface.

3. The manufacturing method of a quartz glass crucible according to claim 1, wherein in step (ii), the temperature of the pure water used in the washing of the inner surface is 55 to 65 °C.

4. The manufacturing method of a quartz glass crucible according to claim 1, further comprising (iv) finish-washing an entire quartz glass crucible with pure water after step (iii).

5. The manufacturing method of a quartz glass crucible according to claim 4, wherein a temperature of the pure water used in step (iv) is 35 °C or lower.

6. The manufacturing method of a quartz glass crucible according to claim 1, wherein step (i) includes serially depositing a natural quartz powder and a synthetic quartz powder as the raw material quartz powder along the inner surface of the rotating mold to form a deposited layer of the raw material quartz powder.

7. The manufacturing method of a quartz glass crucible according to claim 6, wherein step (i) includes forming a transparent layer by sucking the deposited layer of the raw material quartz powder through vent holes formed on the inner surface of the rotating mold at a time when the raw material quartz powder starts to be melted, and forming a bubble layer by reducing suction force of the sucking after the forming of the transparent layer.

* * * * *